(12) United States Patent
Okanobu

(10) Patent No.: US 8,212,420 B2
(45) Date of Patent: Jul. 3, 2012

(54) VARIABLE CAPACITANCE CIRCUIT

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 435 days.

(21) Appl. No.: 12/521,219

(22) PCT Filed: Oct. 2, 2007

(86) PCT No.: PCT/JP2007/069261
§ 371 (c)(1),
(2), (4) Date: Jun. 25, 2009

(87) PCT Pub. No.: WO2008/081629
PCT Pub. Date: Jul. 10, 2008

(65) Prior Publication Data
US 2010/0019582 A1    Jan. 28, 2010

(30) Foreign Application Priority Data
Dec. 27, 2006 (JP) ................... 2006-350792

(51) Int. Cl.
*H02M 3/06* (2006.01)
*H03K 19/094* (2006.01)
(52) U.S. Cl. ............... 307/109; 326/88
(58) Field of Classification Search ........... 307/109; 326/68, 88
See application file for complete search history.

(56) References Cited

U.S. PATENT DOCUMENTS 4,071,830 A * 1/1978 Huntington ............ 330/277
6,137,372 A * 10/2000 Welland ............ 331/117 R

FOREIGN PATENT DOCUMENTS

| JP | 2003-037480 | 2/2003 |
| JP | 2003-234642 | 8/2003 |
| JP | 2005-287009 | 10/2005 |
| JP | 2006-080620 | 3/2006 |

OTHER PUBLICATIONS

International Search Report corresponding to PCT/JP07/069261 dated Dec. 12, 2007.

* cited by examiner

*Primary Examiner* — Michael Rutland Wallis
(74) *Attorney, Agent, or Firm* — SNR Denton US LLP

(57) ABSTRACT

A switch circuit which can operate with a single low voltage is provided. A plurality of (i=0 to n) series circuits of a capacitor (Ci) and a path of the drain-source of a MOS-FET (Qi) are connected in parallel to each other between a first terminal T1 and a second terminal T0. In each of the series circuits, a pull-up resistor Ri is connected between an output terminal of an inverter Ai and a junction between the capacitor Ci and the MOS-FET (Qi). Each bit bi of digital data for controlling the capacitance is supplied to the gate of the MOS-FET (Qi) and the inverter Ai in each of the series circuits. Capacitance which varies in response to the value of the digital data is obtained between the first terminal T1 and the second terminal T0.

5 Claims, 10 Drawing Sheets

FIG. 6
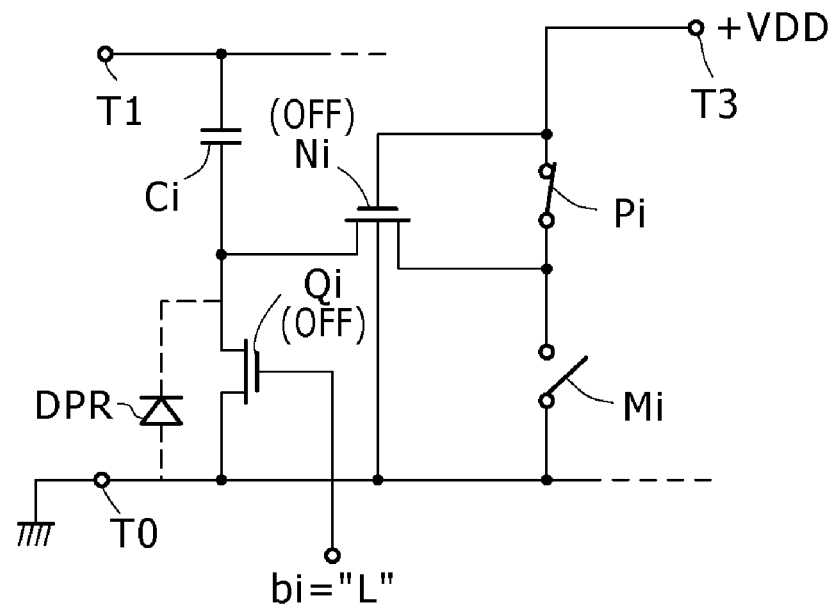
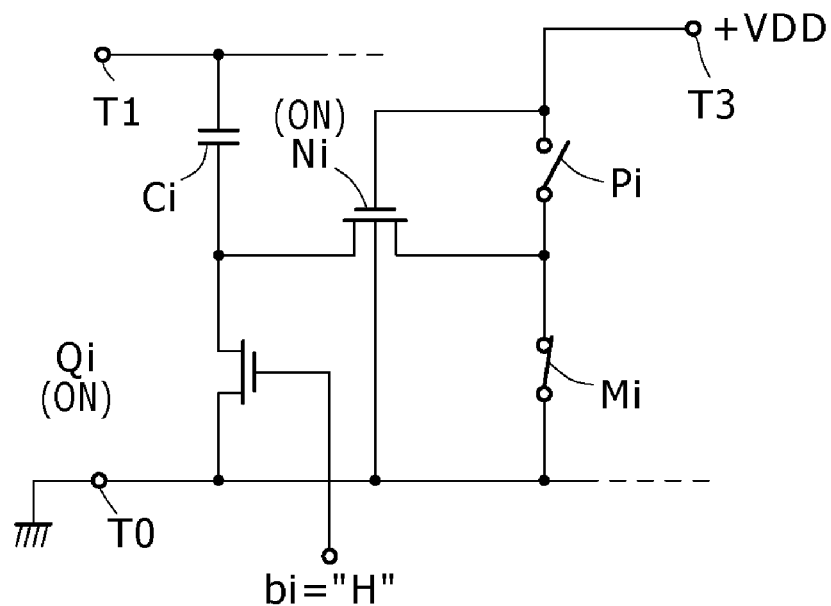

FIG. 9
A
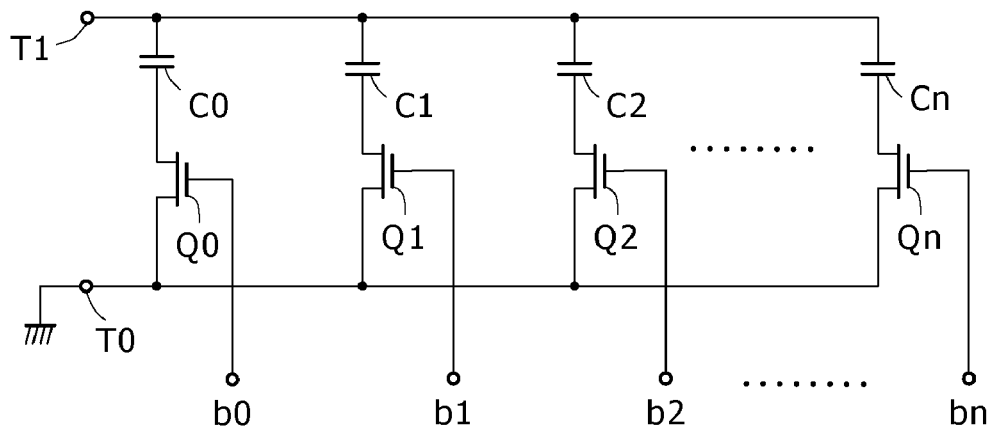
B
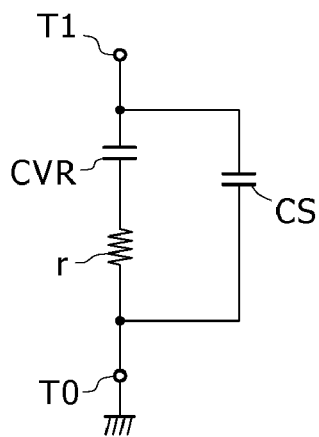
C
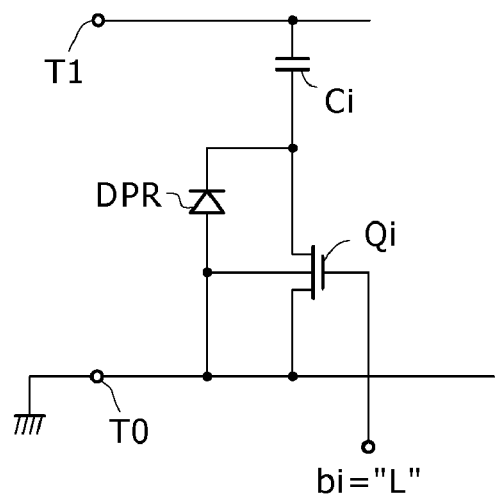

VARIABLE CAPACITANCE CIRCUIT

TECHNICAL FIELD

This invention relates to a variable capacitance circuit.

BACKGROUND ART

A tuning circuit (resonance circuit) of the electronic tuning type frequently uses a variable capacitance diode. However, where a variable capacitance diode is used, since a high bias voltage is required, for example, such a variable capacitance circuit as shown in FIG. 9 has been proposed.

In particular, in this circuit, when the bit bi (i=0 to n) of digital data has the "H" level, since a corresponding MOSFET (Qi) is on, a capacitor Ci connected in series to the FET (Qi) is connected between a terminal T1 and another terminal T0. However, when the bit bi has the "L" level, since the corresponding FET (Qi) is off, the capacitor Ci is not connected.

According, if the capacitor Ci is set to $Ci = C0 \times 2$ to the $(n+1)$th power then the capacitance CVR between the terminal T1 and the terminal T0 can be varied among a number of values equal to 2 to the (n+1)th power by a step of the value C0 between $CVR=0$ and $C0\times(2$ to the $(n+1)$th power$-1)$ with respect to the level of the bits b0 to bn.

In particular, the circuit of A of FIG. 9 is represented as such an equivalent circuit as shown in B of FIG. 9 and is a variable capacitance circuit whose capacitance can be varied with the bits b0 to bn. It is to be noted that, in B of FIG. 9, resistance r is on-resistance of the FET (Qi), and capacitance CS is floating capacitance.

Meanwhile, also such a circuit as shown in FIG. 10 has been proposed as a variable capacitance circuit. In particular, in the circuit of FIG. 10, a bias voltage +VDD is supplied to the drain of an FET (Qi) through a pull-up resistor Ri. And, also in this circuit, since the FET (Qi) is turned on and off with the bits bi of digital data for controlling similarly to the circuit of A of FIG. 9, variable capacitance CVR can be obtained between a terminal T1 and a terminal T0.

And, since those variable capacitance circuits do not require such a high bias voltage as in the case of a variable capacitance diode, they are advantageous in integration (Official Gazette of Japanese Patent Laid-Open No. 2005-287009, Official Gazette of Japanese Patent Laid-Open No. 2006-080620).

However, in the variable capacitance circuit shown in A of FIG. 9, a parasitic diode DPR is produced between the drain and the back gate originating from the structure of the FET (Qi) as shown in C of FIG. 9, and a series circuit of this parasitic diode DPR and the original capacitor Ci is connected between the terminal T1 and the terminal T0.

When the FET (Qi) is on, the parasitic diode DPR does not matter very much because it is shunted by the on resistance r of the FET (Qi).

However, when the FET (Qi) is off, if the amplitude of an input signal supplied between the terminal T1 and the terminal T0 exceeds 0.5 Vp, then the parasitic diode DPR is turned on and the input signal is rectified by the parasitic diode DPR. Therefore, a dc potential difference appears between the drain and the source of the FET (Qi). And, this dc potential difference varies in accordance with the amplitude of the input signal.

As a result, the equivalent capacitance of the parasitic diode DPR varies in accordance with the input signal, and at this time, since the parasitic diode DPR is connected to the terminal T1 through the capacitor Ci, the total capacitance CVR between the terminal T1 and the terminal T0 varies in response to the input signal.

Further, even if such a high input signal as described above is not applied, since the dc potential difference applied across the parasitic diode DPR is 0 V, the junction capacitance of the parasitic diode CPR is comparatively high. And, the signal voltage (input signal) is applied to the parasitic diode DPR through the capacitor Ci. As a result, the junction capacitance of the parasitic diode DPR is varied by the applied signal voltage, and the variation width is great. Besides, the capacitance variation occurs in a region in which the nonlinearity of the capacitance is great.

Accordingly, in the circuit of A of FIG. 9, distortion to the input signal is great, and if the circuit is used, for example, in a tuning circuit of a receiver, then since a disturbance signal component is produced by the distortion, a strong reception signal cannot be handled.

Meanwhile, in the variable capacitance circuit of FIG. 10, even if the parasitic diode DPR is produced, since the parasitic diode DPR is reversely biased through the resistor Ri, if the reverse bias voltage +VDD is set to a high level, then the junction capacitance of the parasitic diode DPR becomes low and also the variation of the junction capacitance with respect to the input signal becomes small. Accordingly, appearance of distortion can be suppressed.

However, in the case of the circuit of FIG. 10, when the FET (Qi) is on, current flows through the resistor Ri with the bias voltage +VDD. Besides, the (n+1) resistors Ri are provided. Accordingly, it is necessary to reduce the current to flow through the resistor Ri. To this end, it is necessary to set the resistance of the resistor Ri to a high value such as, for example, several hundreds k$\Omega$, and where the circuit is integrated, the area occupied by the resistor Ri becomes great, which is not favorable.

The present invention contemplates solution to such problems as described above.

DISCLOSURE OF INVENTION

According to the present invention, there is provided a variable capacitance circuit, wherein:

a plurality of series circuits of a capacitor and a path of the drain-source of a MOS-FET are connected in parallel between a first terminal and a second terminal;

in each of the series circuits, a pull-up resistor is connected between an output terminal of an inverter and a junction between the capacitor and the MOS-FET;

each bit of digital data for controlling the capacitance is supplied to the gate of the MOS-FET and the inverter in each of the series circuits; and capacitance which varies in response to the value of the digital data is obtained between the first terminal and the second terminal.

According to the present invention, the capacitance can be varied with digital data and distortion of an input signal can be suppressed. Further, a high bias voltage is not required and also the current consumption is low, and variable capacitance circuit is suitable also for integration.

BRIEF DESCRIPTION OF DRAWINGS

FIG. 6 is a connection diagram for explaining the circuit of FIG. 5.

FIG. 9 is a connection diagram for explaining the present invention.

BEST MODE FOR CARRYING OUT THE INVENTION

Here, a television receiver with which a variable capacitance circuit according to the present invention is used suitably is described first.

[1] Example of the (Entire) Reception Circuit

Frequencies (channels) used for television broadcast differ among different countries, and also for the color television system, NTSC, PAL, SECAM and so forth are available. Further, not only analog broadcasts but also digital broadcasts are available.

Thus, it has been proposed to divide a reception signal system of a television broadcast into a front end circuit which receives a television broadcast and outputs an intermediate frequency signal, and a base-band processing circuit which processes an output of the front end circuit and outputs a color image signal and a sound signal. In short, it is intended to cope with a difference in the broadcasting system of a television broadcast by such countermeasure.

Therefore, an example of a front end circuit and a baseband processing circuit to which the present invention can be applied are described.

[1-1] Example of the Front End Circuit

Figure 1:
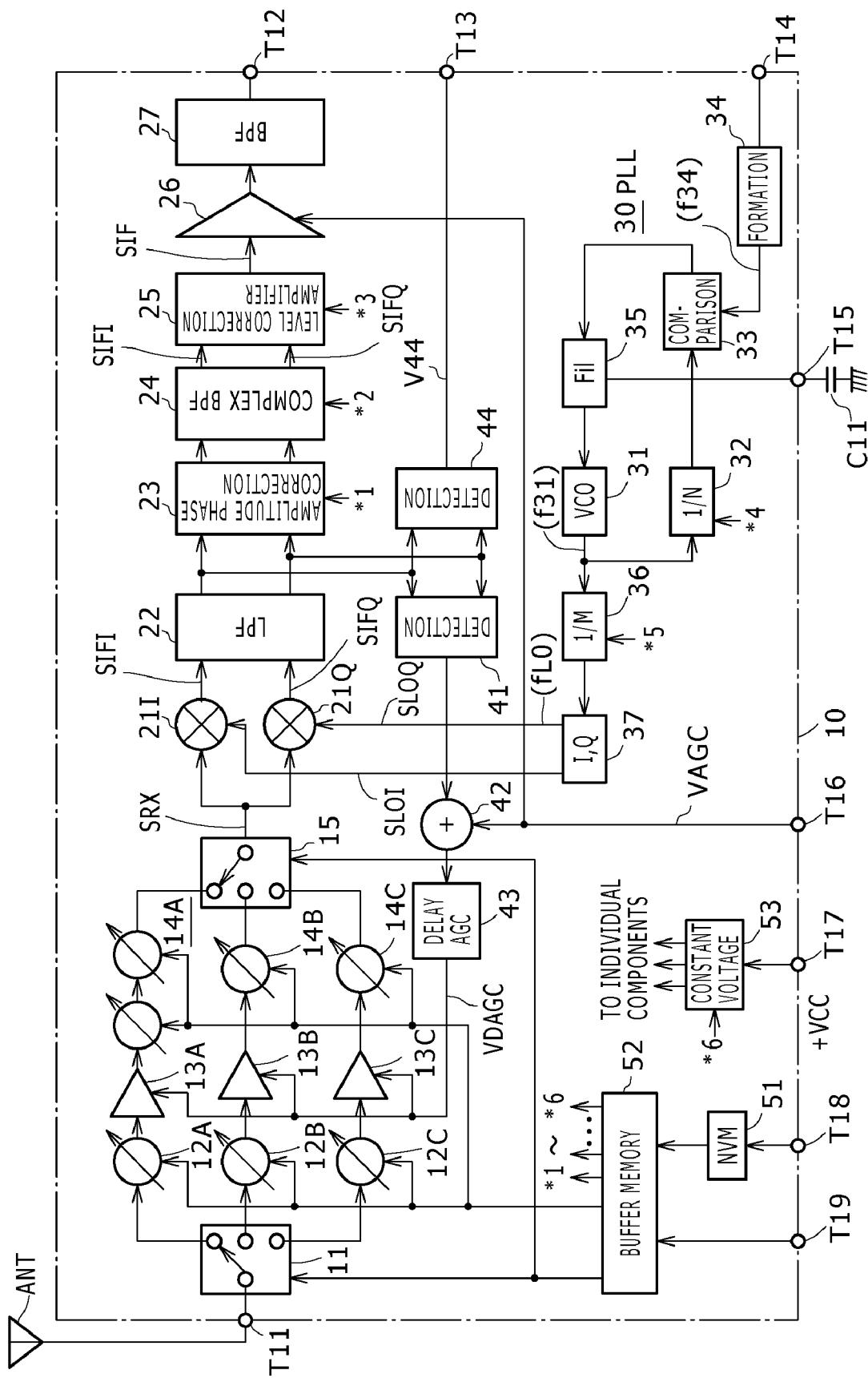
FIG. 1 is a system diagram showing a form of a front end circuit.

FIG. 1 shows an example of a front end circuit which can receive television broadcasts of different countries irrespective of the broadcasting form. In the present example, frequencies used in television broadcasts in different countries are divided into three bands of (A) 46 to 147 MHz (VL band)
(B) 147 to 401 MHz (VH band) and
(C) 401 to 887 MHz (U band)

and, in each of the reception bands, the frequency can be changed in accordance with an object channel.

In particular, referring to FIG. 1, a portion 10 surrounded by a chain line denotes the front end circuit, and this is integrated in a 1-chip IC. Further, this IC (front end circuit) 10 has terminal pins T11 to T19 for external connection.

Then broadcasting wave signals of television broadcasts are received by an antenna ANT, and reception signals of them are selectively supplied from the terminal pin T11 to the antenna tuning circuits 12A to 12C through a switch circuit 11. In this instance, the antenna tuning circuits 12A to 12C correspond to the reception bands of the items (A) to (C) above, respectively, and are configured such that the capacitance of a tuning capacitor is changed with digital data to change the tuning frequency, and as a result, tuning with a reception signal of an object frequency (channel) is carried out. It is to be noted that details are hereafter described.

Then, the reception signals of the antenna tuning circuits 12A to 12C are supplied to a switch circuit 15 through high frequency amplifiers 13A to 13C and further through inter-stage tuning circuits 14A to 14C. The switch circuit 15 is changed over in an interlocked relationship with the switch circuit 11, and accordingly, a reception signal SRX of an object reception band is extracted from the switch circuit 15. Then the extracted reception signal SRX is supplied to mixer circuits 21I and 21Q.

It is to be noted that, while also the tuning circuits 14A to 14C are configured similarly to the tuning circuits 12A to 12C, the tuning circuit 14A is formed as a double tuning circuit. Further, as hereinafter described, the tuning capacitors of the tuning circuits 12A to 14C are built in the IC 10 while tuning coils are externally connected to the IC 10.

Further, an oscillation signal S31 of a predetermined frequency is formed by a VCO 31. This VCO 31 is provided for forming a local oscillation signal and forms part of a PLL 30. In particular, the oscillation signal of the VCO 31 is supplied to a variable dividing circuit 32, by which it is divided into a signal of a frequency of 1/N (N is a positive integer), and this divided signal is supplied to a phase comparison circuit 33. Further, a clock (whose frequency is approximately 1 to 2 MHz) is supplied from the outside to a signal formation circuit 34 through the terminal pin T14, and the clock is divided into a signal of a predetermined frequency f34. This frequency signal is supplied as a reference signal to the phase comparison circuit 33.

And, a comparison output of the phase comparison circuit 33 is supplied to a loop filter 35, from which a dc voltage whose level varies in accordance with a phase difference between an output signal of the variable dividing circuit 32 and an output signal of the signal formation circuit 34 is extracted. This dc voltage is supplied as a control voltage for the oscillation frequency f31 to the VCO 31. It is to be noted that a smoothing capacitor C11 is externally connected to the filter 35 through the terminal pin T15.

Accordingly, since the oscillation frequency f31 of the VCO 31 becomes $$f31 = N \cdot f34 \qquad (1)$$

if the dividing ration N is controlled by a microcomputer (not shown) for system control, then the oscillation frequency f31 of the VCO 31 can be varied. For example, the frequency f31 is 1.8 to 3.6 GHz in response to the reception band and the reception frequency (reception channel).

Then, the oscillation signal of the VCO 31 is supplied to a variable dividing circuit 36, by which it is divided to frequency of 1/M (for example, M=2, 4, 8, 16, 32), and this divided signal is supplied to a dividing circuit 37, by which it is divided into division signals SLOI and SLOQ which have a frequency of ½ and have phases orthogonal to each other. The signals SLOI and SLOQ are supplied as local oscillation signals to mixer circuits 21I and 21Q.

Here, if fLO: frequency of the local oscillation signals SLOI and SLOQ then $$fLO = f31/(2M) \qquad (2)$$
$$= N \cdot f34/(2M)$$
$$= f34 \cdot N/(2M)$$

Accordingly, by changing the dividing ratio M, N, the local oscillation frequency fLO can be varied by a predetermined frequency step over a wide range.

Further, it is assumed that
SRX: reception signal desired to be received
SUD: image interfering signal
and, for the simplification, $$SRX = ERX \cdot \sin \omega RXt$$

ERX: amplitude of the reception signal SRX $$\omega RX = 2\pi fRX$$

fRX: center frequency of the reception signal SRX $$SUD = EUD \cdot \sin \omega pu\, UDt$$

EUD: amplitude of the image interfering signal SUD $$\omega UD = 2\pi fUD$$

fUD: center frequency of the image interfering signal SUD
Further, regarding the local oscillation signals SLOI and SLOQ, $$SLOI = ELO \cdot \sin \omega LOt$$

$$SLOQ = ELO \cdot \cos \omega LOt$$

ELO: amplitude of the signals SLOI and SLOQ $$\omega LO = 2\pi fLO$$

However, if, in this instance, $$\omega IF = 2\pi fIF$$

fIF: intermediate frequency. For example, 4 to 5.5 MHz (changed in accordance with the broadcasting system) then, in the case of the upper heterodyne, $$fRX = fLO - fIF$$

$$fUD = fLO + fIF$$

Accordingly, such signals SIFI and SIFQ as given below are outputted from the mixer circuits 21I and 21Q. In particular, the signals SIFI and SIFQ given by $$\begin{aligned} SIFI &= (SRX + SUD) \times SLOI \\ &= ERX \cdot \sin \omega RXt \times ELO \cdot \sin \omega LOt + \\ &\quad EUD \cdot \sin \omega UDt \times ELO \cdot \sin \omega LOt \\ &= \alpha \{\cos(\omega RX - \omega LO)t - \cos(\omega RX + \omega LO)t\} + \\ &\quad \beta \{\cos(\omega UD - \omega LO)t - \cos(\omega UD + \omega LO)t\} \end{aligned}$$

$$\begin{aligned} SIFQ &= (SRX + SUD) \times SLOQ \\ &= ERX \cdot \sin \omega RXt \times ELO \cdot \cos \omega LOt + \\ &\quad EUD \cdot \sin \omega UDt \times ELO \cdot \cos \omega LOt \\ &= \alpha \{\sin(\omega RX + \omega LO)t + \sin(\omega RX - \omega LO)t\} + \\ &\quad \beta \{\sin(\omega UD + \omega LO)t + \sin(\omega UD - \omega LO)t\} \end{aligned}$$

$$\alpha = ERX \cdot ELO / 2$$
$$\beta = EUD \cdot ELO / 2$$

are extracted.

Then, the signals SIFI and SIFQ are supplied to a low-pass filter 22 which has a wide band in comparison with an occupation bandwidth (for example, 6 to 8 MHz) of the image intermediate frequency and the sound intermediate frequency. As a result, the low-pass filter 22 removes the signal components of the sum angular frequencies ($\omega RX + \omega LO$) and ($\omega UD + \omega LO$) (and the local oscillation signals SLOI and SLOQ), and $$\begin{aligned} SIFI &= \alpha \cdot \cos(\omega RX - \omega LO)t + \beta \cdot \cos(\omega UD - \omega LO)t \\ &= \alpha \cdot \cos \omega IFt + \beta \cdot \cos \omega IFt \end{aligned} \quad (3)$$

$$\begin{aligned} SIFQ &= \alpha \cdot \sin(\omega RX - \omega LO)t + \beta \cdot \sin(\omega UD - \omega LO)t \\ &= -\alpha \cdot \sin \omega IFt + \beta \cdot \sin \omega IFt \end{aligned} \quad (4)$$

are extracted from the low-pass filter 22.

Then, the signals SIFI and SIFQ are supplied to a complex band-pass filter (polyphase band-pass filter) 24 through an amplitude phase correction circuit 23 hereinafter described. This complex band-pass filter 24 has characteristics that
  (a) it has a frequency characteristic of a band-pass filter; that
  (b) it provides a phase difference of 90° between the signal SIFI and the signal SIFQ; and that
  (c) it has two band-pass characteristics having center frequencies at a frequency f0 and another frequency −f0 which are symmetrical with each other with respect to the zero frequency on the frequency axis and can select them in accordance with a relative phase of the input signals.

Accordingly, the complex band-pass filter 24 delays the phase of the signal SIFQ by 90° with respect to the signal SIFI based on the items (b) and (c) to $$SIFI = \alpha \cdot \cos \omega IFt + \beta \cdot \cos \omega IFt \quad (5)$$

$$\begin{aligned} SIFQ &= -\alpha \cdot \sin(\omega IFt - 90°) + \beta \cdot \sin(\omega IFt - 90°) \\ &= \alpha \cdot \cos \omega IFt - \beta \cdot \cos \omega IFt \end{aligned} \quad (6)$$

In short, between the signal SIFI and the signal SIFQ, the signal components $\alpha \cdot \cos \omega IFt$ have the same phase while the signal components $\beta \cdot \cos \omega IFt$ have the opposite phases to each other.

Then, the signals SIFI and SIFQ are supplied to a level correcting amplifier 25, by which the signal SIFI and the signal SIFQ are added, and such a signal SIF as given below is extracted from the level correcting amplifier 25.

In particular, $$\begin{aligned} SIF &= SIFI + SIFQ \\ &= 2\alpha \cdot \cos \omega IFt \\ &= ERX \cdot ELO \cdot \cos \omega IFt \end{aligned} \quad (7)$$

is extracted. This extracted signal SIF is nothing but an intermediate frequency signal when the reception signal SRX is received by the upper heterodyne system. And, this intermediate frequency signal SIF does not include the image interfering signal SUD. It is to be noted that the amplitude phase correction circuit 23 corrects the amplitude and the phase of the signals SIFI and SIFQ so that the expression (7) is satisfied sufficiently, that is, so that the image interfering signal SUD may be minimized.

Further, at this time, the level correcting amplifier 25 corrects the level of the signal SIF so that, even if the level of the signals SIFI and SIFQ differs depending upon the difference of the broadcasting system, an AGC characteristic (particularly a starting level of the AGC) hereinafter described may not change.

Then, this intermediate frequency signal SIF is outputted to the terminal pin T12 through a variable gain amplifier 26 for AGC and further through a band-pass filter 27 for cutting of a dc component and for aliasing.

Accordingly, if the dividing ratio M, N is changed, then an object frequency (channel) can be selected in accordance with the expression (2), and if the intermediate frequency signal SIF outputted to the terminal pin T12 is demodulated in accordance with the broadcasting system, then an object broadcast can be enjoyed.

In this manner, according to the present front end circuit 10, the wide frequency range of 46 to 887 MHz can be coped with using a one-chip IC. Further, the front end circuit 10 can be implemented with a reduced number of parts without deteriorating the disturbance characteristic over a wide frequency range. Furthermore, the single front end circuit 10 can cope with the difference in the broadcasting system between digital broadcasting and analog broadcasting or with the difference of the broadcasting system depending upon the area in the world.

Further, the reception disturbance by harmonics of a clock signal is reduced, and as a result, the reception sensitivity is enhanced. Further, since all circuit parts of the PLL 30 can be formed on a chip except the capacitor C11, it can be formed as a PLL which is tough against disturbance and little suffers from occurrence of disturbance. Further, since only the tuning circuits 14A to 14C are connected to the high frequency amplifiers 13A to 13C, respectively, the load is light and the high frequency amplifiers 13A to 13C have a low distortion feature.

[1-1-1] Example of the AGC

An AGC voltage VAGC is formed by a base-band processing circuit hereinafter described, and this AGC voltage VAGC is supplied as a control signal for the gain of the variable gain amplifier 26 for AGC to the variable gain amplifier 26 for AGC through the terminal pin T16. Accordingly, ordinary AGC is carried out thereby.

Further, for example, where the level of the object reception signal SRX is excessively high or the reception signal SRX has a disturbance wave signal of a high level mixed therein, the ordinary AGC cannot cope with this. Therefore, the signals SIFI and SIFQ outputted from the low-pass filter 22 are supplied to a level detection circuit 41, by which it is detected whether or not the level of the signals SIFI and SIFQ before the AGC is carried out by the variable gain amplifier 26 for AGC exceeds a predetermined value. And, this detection signal and the AGC voltage VAGC of the terminal pin T16 are supplied to an addition circuit 42, and an addition output of the addition circuit 42 is supplied to a forming circuit 43, by which a delay AGC voltage VDAGC is formed. This delay AGC voltage VDAGC is supplied as a gain control signal to the high frequency amplifiers 13A to 13C to carry out delay AGC.

Accordingly, since optimum AGC operation can be carried out from the D/U between the strength of the desired reception signal and the strength of many signals whose reception is not desired, a desired broadcast can be received favorably from among digital broadcasts and analog broadcasts or even if they are mixed with each other.

[1-1-2] Example of the Voltages for Testing and Adjustment

The signals SIFI and SIFQ outputted from the low-pass filter 22 are supplied to and detected and smoothed by a linear detection circuit 44 to form a dc voltage V44 indicative of the level of the signals SIFI and SIFQ, and this voltage V44 is outputted to the terminal pin T13.

The dc voltage V44 outputted to the terminal pin T13 is used upon testing or upon adjustment of the front end circuit 10. For example, the dc voltage V44 can be used to check the level of an input signal (reception signal) over a wide frequency range. In particular, different from an output passed through an intermediate frequency filter of a narrow band, the dc voltage V44 can be used to directly check the attenuation characteristic over a wide band regarding signal lines from the antenna terminal pin T11 to the mixer circuits 21I and 21Q.

On the other hand, when the antenna tuning circuits 12A to 12C and the interstage tuning circuits 14A to 14C are to be adjusted, if an input test signal is applied to the terminal pin T11 and the AGC voltage VAGC to be applied to the terminal pin T16 is fixed to a predetermined value, then tracking adjustment can be carried out from a variation of the dc voltage V44. Further, adjustment of each function and measurement of a characteristic of the front end circuit 10 can be carried out with digital data to carry out automatic adjustment and automatic measurement.

[1-1-3] Constant Voltage Circuit

The IC 10 includes a constant voltage circuit 53, to which a power supply voltage +VCC is supplied from the terminal pin T17. This constant voltage circuit 53 utilizes a band gap of the PN junction to form a fixed voltage of a predetermined value from the power supply voltage +VCC, and the formed fixed voltage is supplied to the individual circuits of the IC 10. It is to be noted that the output voltage of the constant voltage circuit 53 can be adjusted finely.

Accordingly, even where the circuits are formed from MOS-FETs, the voltage to be supplied to the circuits can be set rather high, and the performance of the MOSFETs can be extracted to the utmost.

[1-1-4] Initialization

Since the center frequency and the passband width of the complex band-pass filter 24, the correction amount of the amplitude phase correction circuit 23 and the gain of the level correcting amplifier 25 need conform with a broadcasting system of a television broadcast to be received, they are variable and can be set from the outside. For example, the center frequency of the complex band-pass filter 24 is variable within a range of 3.8 to 5.5 MHz and the passband is variable within a range of 5.7 to 8 MHz.

And, upon assembly, upon shipment from a factory or in a like case, the preset values of the circuits 23 to 25 are written from the terminal pin T18 into a nonvolatile memory 51. Further, also data for tracking of the tuning circuits 12A to 12C and 14A to 14C (data for fine adjustment of the tuning frequency) and data for fine adjustment of the output voltage of the constant voltage circuit 53 are written similarly from the terminal pin T18 into the nonvolatile memory 51. Accordingly, the characteristic of the individual circuits can be set to that ready for the broadcasting system of a television broadcast to be received.

[1-1-5] Operation Upon Use

Also when the power supply to the receiver which uses this IC 10 is made available, the preset values of the nonvolatile memory 51 are copied into a buffer memory 52, and the copied preset values are supplied individually as default values into the circuits 12A to 12C, 14A to 14C, 23 to 25 and 53.

Then, if the user selects a channel, then data thereof is supplied to and stored once into the buffer memory 52 from a microcomputer (not shown) for system control through the terminal pin T19, and the stored data are supplied to the switch circuits 11 and 15, tuning circuits 12A to 12C, 14A to 14C and variable dividing circuits 32 and 36. Consequently, a reception band including an object channel (frequency) is selected, and the object channel is selected in the selected reception band.

[1-1-6] Summary

With the front end circuit 10 shown in FIG. 1, television broadcasts in the frequency band of 46 to 887 MHz as indicated by the items (A) to (C) can be received. Then, at this time, since the center frequency and the pass-band width of the complex band-pass filter 24 are variable, the front end circuit 10 can cope not only with ground wave digital television broadcasts and ground wave analog television broadcasts in Japan but also with digital television broadcasts and analog television broadcasts outside Japan.

[1-2] Example of the Base-Band Processing Circuit

Figure 2:
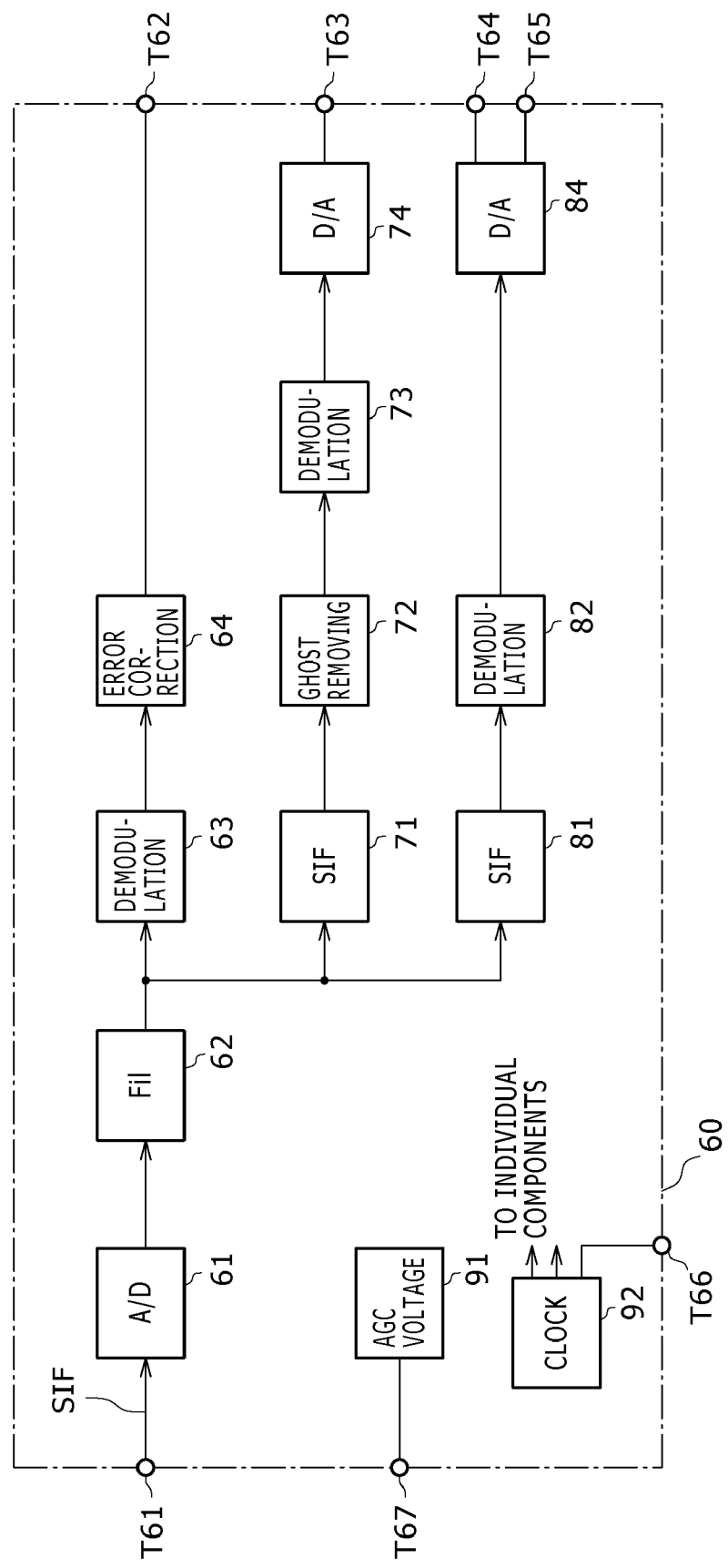
FIG. 2 is a system diagram showing a form of a baseband processing circuit which can be connected to the circuit of FIG. 1.

FIG. 2 shows an example of the base-band processing circuit, and this is provided for processing the intermediate frequency signal SIF outputted from the front end circuit 10 to output a color image signal and a sound signal. In particular, referring to FIG. 2, a portion 60 surrounded by a chain line indicates the base-band processing circuit, which is integrated in a 1-chip IC. Further, the IC (base-band processing circuit) 60 has terminal pins T61 to T67 for external connection.

And, the intermediate frequency signal SIF outputted from the terminal pin T12 of the front end circuit 10 is supplied from the terminal pin T61 to an A/D converter circuit 61, by which it is A/D converted into a digital intermediate frequency signal. From this digital intermediate frequency signal SIF, unnecessary frequency components are removed by a filter 62.

Then, upon reception of a digital television broadcast, the digital intermediate frequency signal SIF from the filter 62 is supplied to a demodulation circuit 63, by which a digital signal of the base-band is demodulated and extracted. This demodulation output is supplied to an error correction circuit 64, by which it is converted into an error-corrected data stream. This data stream is outputted to the terminal pin T62. Accordingly, if the signal of the terminal pin T62 is decoded in accordance with the broadcasting system thereof, then the original color image signal and sound signal can be obtained.

On the other hand, upon reception of an analog television broadcast, the digital intermediate frequency signal SIF from the filter 62 is supplied to an image intermediate frequency filter 71, by which a digital image intermediate frequency signal is extracted. This signal is supplied, after ghost components are removed therefrom by a ghost removing circuit 72, to a demodulation circuit 73, by which a digital color image signal is demodulated. Then, this digital signal is supplied to a D/A converter circuit 74, by which it is D/A converted into an analog color image signal, and this color image signal is outputted to the terminal pin T63.

Further, upon reception of an analog television broadcast, the digital intermediate frequency signal SIF from the filter 62 is supplied to a sound intermediate frequency filter 81, by which a digital sound intermediate frequency signal is extracted. This signal is supplied to a demodulation circuit 82, by which a digital sound signal is demodulated. Then, this digital sound signal is supplied to a D/A converter circuit 84, by which it is D/A converted into sound signals of the left and right channels. Those sound signals are outputted to the terminal pins T64 and T65.

Further, an AGC voltage VAGC is formed by an AGC voltage forming circuit 91, and this AGC voltage VAGC is outputted to the terminal pin T67 and supplied to the terminal pin T16 of the front end circuit 10. Consequently, ordinal AGC and delay AGC are carried out as described hereinabove.

Further, a clock forming circuit 92 forms a clock of a predetermined frequency, and this clock is supplied to each component of the base-band processing circuit 60 and is supplied to the signal formation circuit 34 through the terminal pin T66 and further through the terminal pin T14 of the front end circuit 10.

Accordingly, the reception disturbance by harmonics of the clock and so forth is reduced, and as a result, the reception sensitivity is enhanced.

[2] Particular Example of the High Frequency Stage

Figure 3:
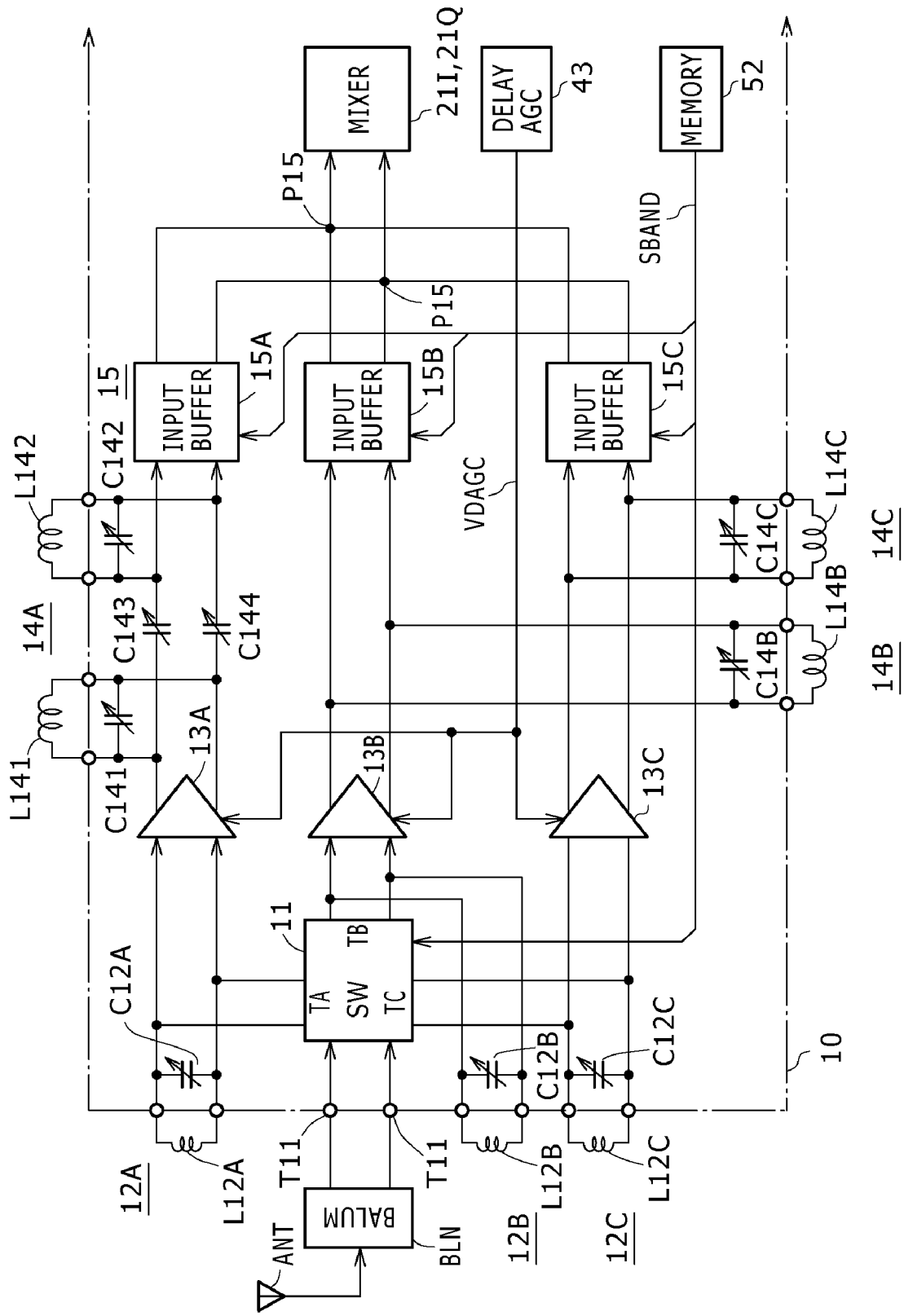
FIG. 3 is a connection diagram showing a form of a high frequency stage of the front end circuit.

FIG. 3 shows an example of a high frequency signal system from the switch circuit 11 to the switch circuit 15 of the front end circuit 10. It is to be noted that also this high frequency signal system is formed as that of the balance type.

In particular, reception signals of the antenna ANT are supplied to the switch circuit 11 through the terminal pins T11, T11 after they are converted into balanced reception signals by a balun BLN. This switch circuit 11 is formed equivalently as seen in FIG. 1 and selectively supplies reception signals supplied thereto through the terminal pins T11, T11 to the antenna tuning circuits 12A to 12C.

To this end, the switch circuit 11 is connected at first output terminals TA thereof to input terminals of the high frequency amplifier 13A, and the antenna tuning circuit 12A is connected in parallel to signal lines between the first output terminals TA of the switch circuit 11 and the input terminals of the high frequency amplifier 13A. In this instance, the tuning circuit 12A is formed such that a tuning coil L12A is externally connected to the IC 10 through terminal pins and a tuning capacitor C12A is built in the IC 10. It is to be noted that the capacitance of the capacitor C12A is changed with digital data to change the tuning frequency as hereinafter described.

Further, output terminals of the high frequency amplifier 13A are connected to input terminals of the input buffer circuit 15A through tuning capacitors C143 and C144, and a tuning coil L141 and a tuning capacitor C141 are connected in parallel to the output terminals of the high frequency amplifier 13A. Meanwhile, a tuning coil L142 and a tuning capacitor C142 are connected in parallel to input terminals of the input buffer circuit 15A. Thus, the interstage tuning circuit 14A is formed in a double tuning form.

It is to be noted that, at this time, the coils L141 and L142 are externally connected to the IC 10 through terminal pins. Further, the capacitors C141 to C144 are built in the IC 10, and the capacitance of them is changed with digital data to vary the tuning frequency. The high frequency stage of the VL band indicated in the item (A) is formed in this manner.

Further, second output terminals TB of the switch circuit 11 are connected to input terminals of the high frequency amplifier 13B, and the antenna tuning circuit 12B is connected in parallel to signal lines between the second output terminals TB of the switch circuit 11 and input terminals of the high frequency amplifier 13B.

Further, output terminals of the high frequency amplifier 13B are connected to input terminals of the input buffer circuit 15B, and a tuning coil L14B and a tuning capacitor C14B are connected in parallel to signal lines between the output terminals of the high frequency amplifier 13B and the input terminals of the input buffer circuit 15B to form the interstage tuning circuit 14B. It is to be noted that, at this time, the coils L14B and L14C are externally connected to the IC 10 through terminal pins while the capacitors C14B and C14C are built in the IC 10 and the capacitance thereof is changed with digital data to vary the tuning frequency. The high frequency stage of the VH band indicated in the item (B) is formed in this manner.

Further, the switch circuit 11 are connected at third output terminals TC thereof to input terminals of the input buffer circuit 15C through the high frequency amplifier 13C, and the input terminal antenna tuning circuit 12C of the high frequency amplifier 13C is connected in parallel while the interstage tuning circuit 14C is connected in parallel to the input terminals of the input buffer circuit 15C. In this instance, the tuning circuit 12C is configured such that a tuning coil L12C is externally connected to the IC 10 through terminal pins while a tuning capacitor C12C is built in the IC 10. Meanwhile, the tuning circuit 14C is configured such that a tuning coil L14C is externally connected to the IC 10 through terminal pins while a tuning capacitor C14C is built in the IC 10. The high frequency stage of the U band indicated in the item (C) is formed in this manner.

Then, the input buffer circuits 15A to 15C are connected at output terminals thereof commonly to nodes P15, P15 and connected to input terminals of the mixer circuits 21I and 21Q. Further, the delay AGC voltage VDAGC is supplied from the forming circuit 43 to the high frequency amplifiers 13A to 13C.

Further, a reception band switching signal SBAND is supplied from the buffer memory 52 to the switch circuit 11, and this switching signal SBAND is supplied as a control signal for permission/inhibition of operation of the input buffer circuits 15A to 15C to the input buffer circuits 15A to 15C so that the input buffer circuits 15A to 15C are controlled in an interlocking relationship with the switching of the switch circuit 11. In other words, the switch circuit 11 is formed from the input buffer circuits 15A to 15C.

With such a configuration as describe above, for example, where reception of the VL band indicated in the item (A) is selected with the switching signal SBAND, reception signals are supplied from the switch circuit 11 to the tuning circuit 12A and operation of the input buffer circuit 15A is permitted. However, the reception signals are not supplied to the tuning circuits 12B and 12C and besides operation of the input buffer circuits 15B and 15C is inhibited.

Accordingly, reception of the VL band indicated in the item (A) is permitted, and a channel (frequency) selected by the tuning circuits 12A and 14A is outputted to the nodes P15, P15 and supplied to the mixer circuits 21I and 21Q. And, similar operation is carried out also with regard to reception time of the reception bands of the items (B) and (C).

In this manner, with the high frequency stage shown in FIG. 3, a reception band of the item (A) to (C) is selected, and a channel in the selected reception band can be selected. And, in this instance, since only the tuning circuits 14A to 14C are connected to the high frequency amplifiers 13A to 13C, respectively, the load is light and the high frequency amplifiers 13A to 13C provide low distortion.

[3] Examples of the Variable Capacitance Circuit According to the Present Invention

[3-1] Particular Example (Part 1)

Figure 4:
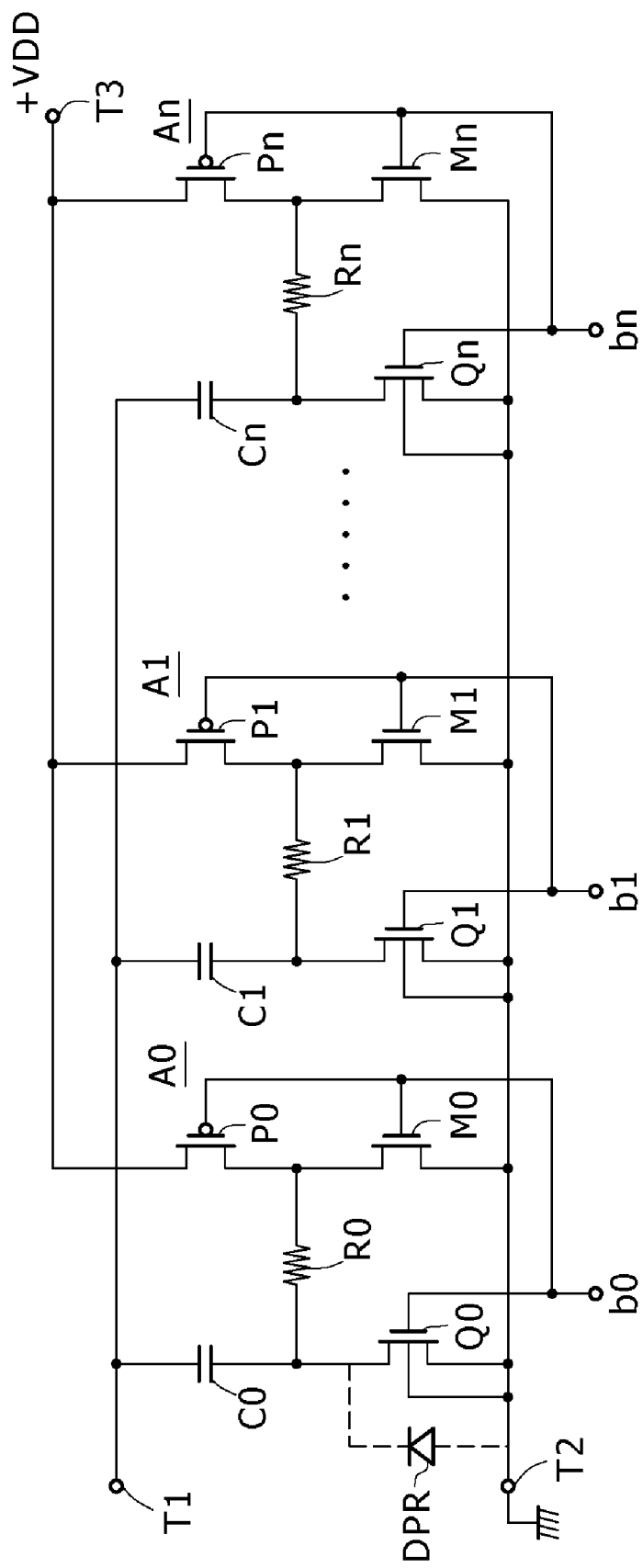
FIG. 4 is a connection diagram showing a form of a variable capacitance circuit according to the present invention.

FIG. 4 shows an example of a variable capacitance circuit according to the present invention. This variable capacitance circuit can be used as the variable capacitors C12A to C12C, C14₁, C14₂, C14B and C14C of the tuning circuits 12A to 12C and 14A to 14C described hereinabove. It is to be noted that, in the present example, a capacitance controlling signal is digital data of (n+1) bits, and the capacitance can be changed among a number of values equal to 2 to the (n+1)th power.

In particular, referring to FIG. 4, a capacitor Ci and a path of the drain-source of a MOS-FET (Qi) of the N channel are connected in series between a terminal T1 on the hot side and a terminal T0 on the ground side. It is to be noted that i=0 to n. Further, the FET (Qi) is connected at the back gate thereof to the terminal T0, and this terminal T0 is grounded.

Further, between a bias terminal T3 and the terminal T0, a path of the drain-source of a MOS-FET (Pi) of the P channel and a path of the source-drain of a MOS-FET (Mi) of the N channel are connected, and they are connected at the gate thereof to each other to form an inverter Ai of the CMOS type. And, the FETs (Pi, Mi) are connected at the source thereof to the drain of the FET (Qi) through a pull-up resistor Ri. Further, a bit bi of digital data for controllong the capacitance is supplied to the gate of the FETs (Qi, Pi, Mi).

It is to be noted that the value of the capacitors C0 to Cn is set to $$Ci = C0 \times 2 \text{ to the } i\text{th power} \quad (8)$$

As an example, in the case of the variable capacitors of the tuning circuits 12A to 12C and 14A to 14C, n=8.

With such a configuration as described above, when b0="H," the FET (Q0) is turned on and the capacitor C0 is connected between the terminal T1 and the terminal T0. However, when b0="L," the FET (Q0) is turned off, and the capacitor C0 is not connected between the terminal T1 and the terminal T0.

And, similar operation is carried out with regard to the FETs (Q1 to Qn) and the bits b1 to bn, and on and off states of the FETs (Q0 to Qn) correspond to the "H" level and the "L" level of the bits b0 to bn and a number of combinations equal to 2 to the (n+1)th power are available. Therefore, the capacitance CVR between the terminal T1 and the terminal T0 varies at a number of steps equal to 2 to the (n+1)th power in a unit of the capacitor C0 within a range from $$CVR = 0$$

to $$CTTL = CAP + C0 \times (2 \text{ to the } (n+1)th \text{ power}) - 1)$$

Accordingly, the circuit of FIG. 9 acts as a variable capacitance circuit which can vary the capacitance CVR between the terminal T1 and the terminal T0 to arbitrary capacitance by the necessary variation amount C0 with the bits b0 to bn.

And, with the present variable capacitance circuit, where bi="L" and the FET (Qi) is off, the FET (Pi) is on and the FET (Mi) is off, and therefore, a bias voltage +VDD of the terminal T3 is supplied to the drain of the FET (Qi) through the FET (Pi) and further through the resistor Ri. Consequently, the drain of the FET (Qi) is pulled up.

Accordingly, for example, as seen in C of FIG. 9 or as indicated by a broken line in FIG. 4, even if a parasitic diode DPR is produced in the FET (Q0), since the parasitic diode DPR is reversely biased through the resistor Ri, if the reverse bias voltage +VDD is set to a predetermined value, then the junction capacitance of the parasitic diode DPR becomes lower and the variation of the junction capacitance to the input signal becomes smaller. Therefore, appearance of distortion can be suppressed.

On the other hand, if bi="H" and the FET (Qi) is on, since the FET (Pi) is off, even if the bias voltage +VDD of the terminal T3 leaks to the resistor Ri through the FET (Pi), since this is nothing but leak current of the FET (Pi) which is in the off state, this can be ignored. Accordingly, there is no necessity to set the value of the resistor Ri to a high value, and therefore, in the case of integration, the area occupied by the resistor Ri is small, which is advantageous in integration.

In this manner, with the variable capacitance circuit of FIG. 4, the capacitance CVR can be carried with digital data (bits b0 to bn) and distortion of the input signal can be suppressed. Further, such a high reverse bias voltage as in the case of a variable capacitance diode is not required, and also the current consumption is low. Therefore, the variable capacitance circuit is suitable for integration.

[3-2] Particular Example (Part 2)

In the variable capacitance circuit of FIG. 4, when the FET (Qi) is off, since the FET (Pi) is on, and therefore, a path of the terminal T1→capacitor Ci→resistor Ri→FET (Pi)→terminal T3 is formed. Consequently, if the resistor Ri is not set to a sufficiently high value, then the Q value of the capacitance CVR between the terminal T1 and the terminal T0 drops. However, if a resistor of a high value is formed in an IC, then this is not preference to the IC because the occupation area of the resistor is great.

Figure 5:
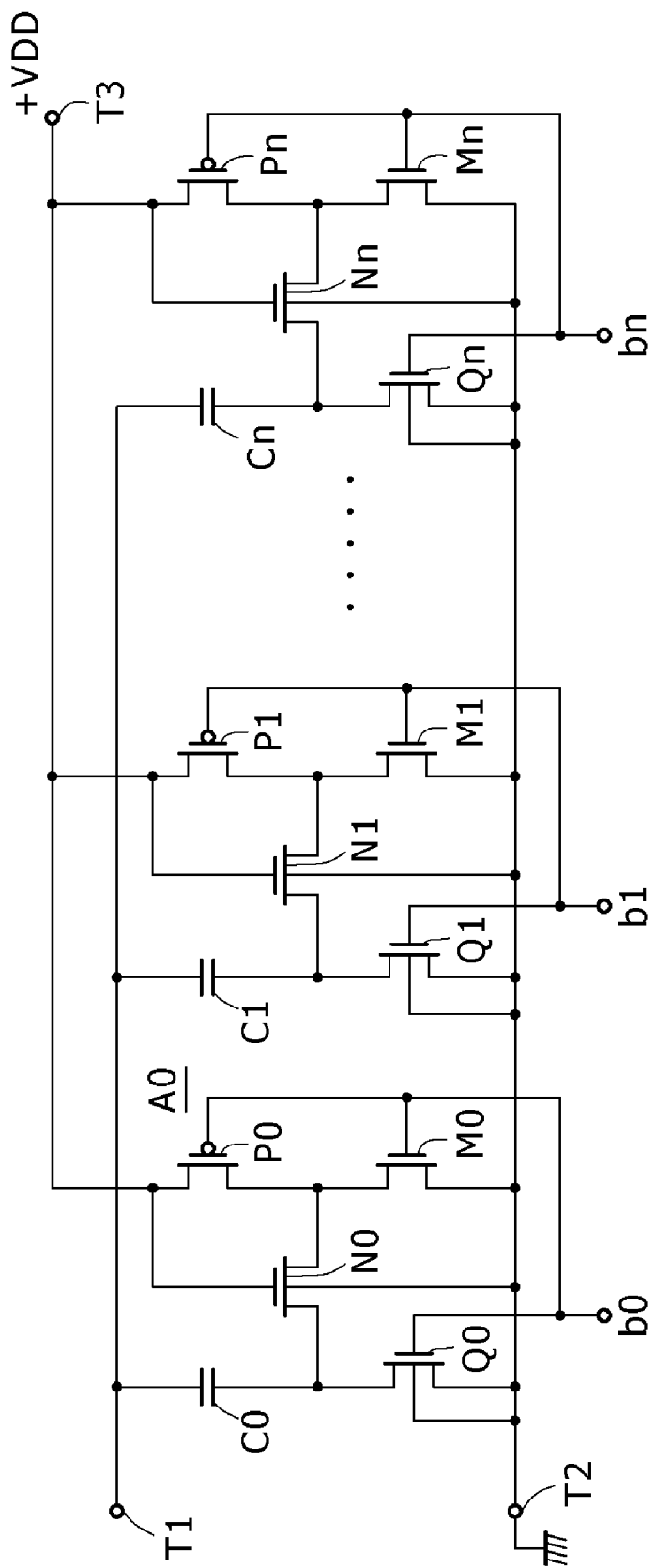
FIG. 5 is a connection diagram showing another form of the variable capacitance circuit according to the present invention.

Therefore, a variable capacitance circuit shown in FIG. 5 is configured taking also such a problem as just described into consideration. In particular, in the variable capacitance shown in FIG. 5, an N-channel MOS-FET (Ni) is provided in place of the resistor Ri of the variable capacitance circuit shown in FIG. 4, and the FET (Ni) is connected at the source thereof to the source of the FETs (Pi, Mi) and the FET (Ni) is connected at the drain thereof to the drain of the FET (Qi).

Further, the FET (Ni) is connected at the gate thereof to the terminal T3 such that a bias voltage +VDD is supplied thereto, and is connected at the back gate thereof to the terminal T0. It is to be noted that the occupation area of the FET (Ni) is sufficiently small in comparison with the FET (Qi) and is, for example, a minimum size.

With such a configuration as described above, when the controlling bit bi has the "L" level, since the FET (Qi) is off as seen in A of FIG. 6, the capacitor Ci is not connected between the terminals T1 and T0.

Then, in this instance, since the FET (Pi) is controlled to an on state and the FETs (Mi, Ni) are controlled to an off state with the bit bi, leak current flows along a path of the terminal T3→path of the gate-drain of the FET (Ni)→path of the drain-source of the FET (Qi)→terminal T0, and the FET (Qi), that is, the parasitic diode DPR, is reversely biased by the voltage (VDD−VGS). It is to be noted that the voltage VGS is a gate-source voltage of the FET (Ni) which can be determined from leak current of the FET (Qi) and leak current of the FET (Ni).

Accordingly, if an input signal of a large amplitude is supplied, then since the FET (Ni) is biased by the leak current, a rectification operation occurs and distortion is estimated to appear. However, since the FET (Ni) is formed sufficiently small, even if a rectification action is caused by the leak current, appearance of distortion can be reduced. Further, although the input signal is rectified and a dc voltage is applied to the parasitic diode DPR of the FET (Qi), since this dc voltage is sufficiently low in comparison with the voltage (VDD−VGS), even if the amplitude of the input signal varies, the variation of the capacitance of the parasitic diode DPR is sufficiently small. Consequently, the distortion can be suppressed to a sufficiently low level.

On the other hand, when the controlling bit bi has the "H" level, since the FET (Qi) is exhibits an on state as seen in B of FIG. 6, and the capacitor Ci is connected between the terminals T1 and T0. It is to be noted that, at this time, the FET (Pi) is off and the FETs (Mi, Ni) are off in response to the bit bi, and the FET (Ni) is connected in parallel to the FET (Qi) through the FET (Mi), and therefore, the FET (Ni) does not have an influence on the operation.

And, although the FET (Ni) acts as the pull-up resistor Ri shown in FIG. 4, since the FET (Qi) has an occupation area sufficiently small in comparison with the FET (Qi), or in other words, since the FET (Qi) has a minimum size as a TFT, it is suitable for integration.

Further, if the gate width of the FET (Qi) is set in proportion to the value of the capacitor Ci connected to the FET (Qi), the Q value as variable capacitance can be kept fixed.

[3-3] Particular Example (Part 3)

Figure 7:
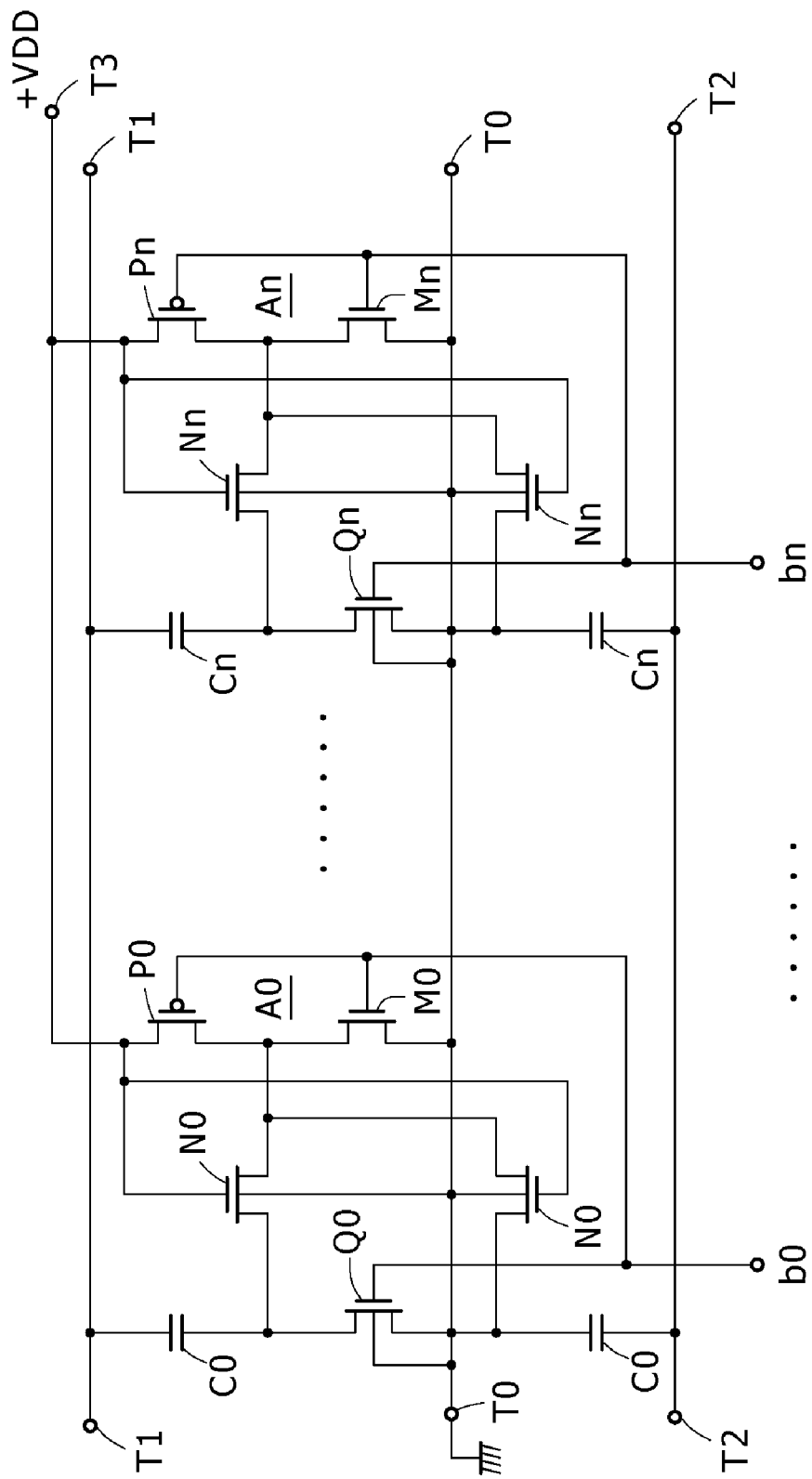
FIG. 7 is a connection diagram showing another form of the variable capacitance circuit.

FIG. 7 shows an example in a case wherein the variable capacitance circuit shown in FIG. 5 is formed as that of the balance type. In particular, a first capacitor Ci, a path of the drain-source of the FET (Qi) and a second capacitor Ci are connected in series between the terminal T1 and the terminal T2. The FET (Qi) is connected at the back gate thereof to the ground terminal T0.

Further, an inverter Ai of the CMOS type is formed from FETs (Pi, Mi), and an operating voltage +VDD is supplied from the power supply terminal T3 and the ground terminal T0. And, the FETs (Pi, Mi) are connected at the source thereof to the source of the FETs (Ni, Ni), and the FETs (Ni, Ni) are connected at the drain thereof to the drain and the source of the FET (Qi). Further, the FETs (Ni, Ni) are connected at the gate thereof to the terminal T3 such that the bias voltage +VDD is supplied thereto, and are connected at the back gate thereof to the terminal T0. It is to be noted that the occupation area of the FET (Ni) is sufficiently small in comparison with the FET (Qi).

Meanwhile, the bit bi of digital data for controlling the capacitance is supplied to the gate of the FETs (Qi, Pi, Mi).

With such a configuration as described above, since the FETs (Qi, Qi) are controlled with the bit bi similarly as in the variable capacitance circuit of FIG. 5, variable capacitance of the balance type can be obtained between the terminals T1 and T2.

And, in this instance, since the capacitor Ci, Ci in pair are controlled by the single FET (Qi), the Q value can be increased to approximately twice in comparison with that in the case of FIG. 5. Further, where a reverse bias voltage is supplied to the parasitic diode DPR of the FET (Qi), if it is supplied through the resistor Ri as seen in FIG. 4, then since the number of resistors Ri is doubled, this is more disadvantageous to integration. However, the circuit of FIG. 7 is suitable for integration because the FETs (Ni, Ni) can be formed in a minimum size.

[3-4] Particular Example (Part 4)

In the variable capacitance circuit of FIG. 7, as described hereinabove with reference to C of FIG. 9 and as shown also in FIG. 8, when the FET (Qi) is off, parasitic diodes DPR, DPR are produced in the FETs (Qi) and leak current flows through the parasitic diodes DPR, DPR. This leak current exhibits an extremely great variation by the temperature, and depending upon the size and the characteristic of the FETs (Qi, Ni, Ni), a phenomenon sometimes occurs that, at a low temperature, the leak current is lower than the leak current between the drain and the source of the FETs (Ni, Ni), but at a high temperature, the relationship is reversed.

As a result, the voltage applied to the FET (Qi) is substantially equal to the voltage VDD at a low temperature but becomes the voltage (VDD−VGS) when the temperature becomes higher than a certain temperature TTH, and therefore, the junction capacitance of the parasitic diodes DPR, DPR varies by a further greater amount than the original temperature variation across the temperature TTH.

Figure 8:
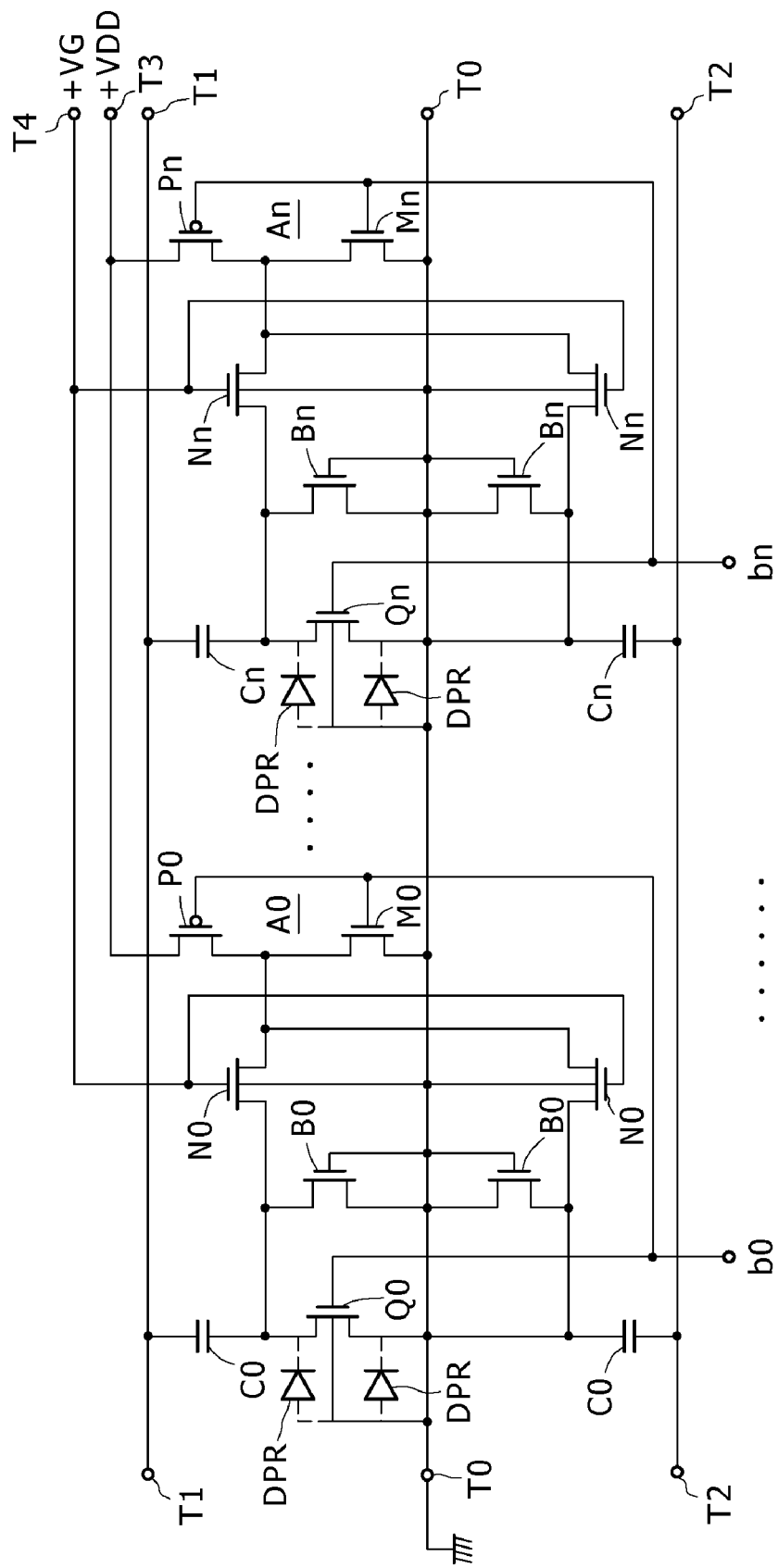
FIG. 8 is a connection diagram showing a further form of the variable capacitance circuit.
Figure 10:
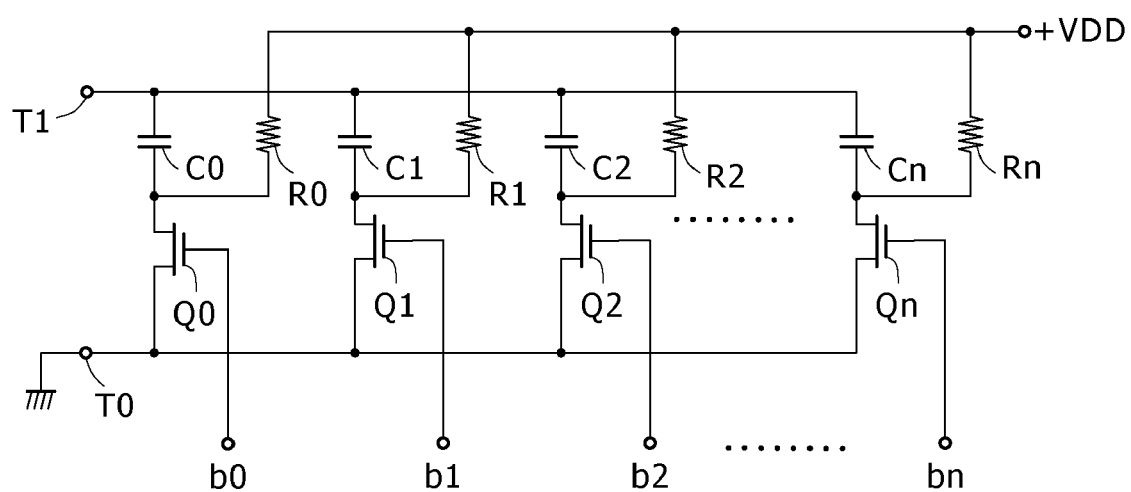
FIG. 10 is a connection diagram for explaining the present invention.

FIG. 8 shows the variable capacitance circuit of FIG. 7 where such a capacitance variation by the temperature as just described is suppressed. Therefore, in the circuit of FIG. 8, a path of the drain-source of the FETs (Bi, Bi) is connected between the drain and source of the FET (Qi) and the terminal T0, and data of this is connected to the terminal T0. It is to be noted that the FETs (Ni, Ni) are connected at the gate thereof to the terminal T4 such that a voltage +VG having a temperature coefficient of zero or a positive value is supplied thereto.

Accordingly, since leak current of the FETs (Bi, Bi) flows through the FETs (Ni, Ni) in addition to the leak current to the FET (Q0), also the leak current flowing through the FETs (Ni, Ni) at a low temperature increases. As a result, since, also at a low temperature, the voltage (VDD−VGS) is applied to the parasitic diodes DPR, DPR, the temperature characteristic is improved.

Further, id the voltage +VG having a temperature coefficient of zero or a positive value is applied to the gate of the FETs (Ni, Ni) to set the temperature characteristic of the voltage VG taking the temperature characteristic of the junction capacitance of the parasitic diodes DPR, DPR (the temperature characteristic normally has a positive temperature characteristic), the gate-source voltage VGS of the FET (Ni) and the temperature characteristic of current flowing through the FETs (Bi, Bi) into consideration, then the temperature variation of the parasitic diodes DPR, DPR can be almost eliminated.

Further, by increasing the temperature coefficient of the voltage VG, also the temperature variation of the floating capacitance connected in parallel between the terminal T1 and the terminal T2 and the capacitance of an electrostatic protection countermeasure diode can be almost canceled.

[4] Conclusion

The variable capacitance circuit described above can be concluded in the following manner. In particular,

(11) The capacitance CVR can be changed with digital data (bits b0 to bn).

(12) Distortion of the input signal can be suppressed.

(13) Also current consumption is low, and the variable capacitance circuit is suitable for integration.

(14) A variable capacitance circuit whose Q value and variable capacitance ratio are high can be implemented.

(15) Where the variable capacitance circuit is integrated, the occupation area can be made comparatively small.

(16) A variable capacitance circuit whose capacitance variation with respect to a temperature variation is small can be implemented.

(17) Also the variation of the capacitance of a different circuit by the temperature can be absorbed, and a temperature characteristic of the entire circuit is improved.

(18) Alteration of the temperature coefficient only requires alteration of the voltage VG to be supplied to the gate of the FETs (Ni, Ni), and the burden on the power supply is equal to zero. Accordingly, where a power supply of a different temperature coefficient is required, a countermeasure can be taken readily.

(19) Since a variable capacitor which has a great variation range and a high Q value can be implemented, a tuning circuit or a filter which uses this can implement a filter characteristic which is low in loss and superior in selectivity.

(20) Since such a high voltage as is required by a variable capacitance diode is not required and all elements can operate with a low voltage, where the elements are integrated, the power supply may provide a low voltage and reduction of the power consumption can be implemented.

(21) Since a filter of low distortion can be implemented, a receiver can be integrated without deteriorating the disturbance characteristic of the receiver.

[5] Others

In the foregoing, also it is possible to use the local oscillation signals SLOI and SLOQ and the complex band-pass filter 24 to set the phase of the intermediate frequency signal components of the reception signal SRX in the signals SIFI and SIFQ opposite to each other and set the phases of the intermediate frequency signal components of the image interfering signal SUD same to each other. In this instance, if subtraction between the signal SIFI and the signal SIF1 is carried out, then the intermediate frequency signal SIF of the reception signal SRX can be obtained.

In particular, a phase relationship between the local oscillation signals SLOI and SLOQ and phase shifting of the complex band-pass filter 24 should be set in the signals SIFI and SIFQ such that the intermediate frequency signal components in the reception signal and the intermediate frequency signal components in the image disturbance signal may have phases opposite to each other to carry out addition or subtraction of the signals SIFI and SIFQ.

Further, also it is possible to reverse the connection positions of the complex band-pass filter 24 and the amplitude phase correction circuit 23.

Further, if an amplifier 25 subtracts the expression (6) from the expression (5), then $$SIF = SIFI - SIFQ$$

$$= 2\beta \cdot \cos \omega IFt$$

$$= EUD \cdot ELO \cdot \cos \omega IFt \qquad (9)$$

and the image interfering signal SUD can be extracted. Consequently, the amplitude phase correction circuit 23 can correct the amplitude and the phase of the signals SIFI and SIFQ so that the image interfering signal SUD may be minimized.

LIST OF ABBREVIATED WORDS

A/D: Analog to Digital
AGC: Automatic Gain Control
CMOS: Complementary MOS
D/A: Digital to Analog
D/U: Desire to Undesire ratio
FET: Field Effect Transistor
IC: Integrated Circuit
MOS: Metal Oxide Semiconductor
NTSC: National Television System Committee
PAL: Phase Alternation by Line
PLL: Phase Locked Loop
SECAM: Sequential a Memoire Color Television System
VCO: Voltage Controlled Oscillator

The invention claimed is:

1. A variable capacitance circuit, comprising:
a plurality of series circuits having a capacitor and a path of a drain-source of a first MOS-FET, said plurality of series circuits being connected in parallel between a first terminal and a second terminal;
in each of said series circuits, a pull-up resistor connected between an output terminal of an inverter and a junction between said capacitor and said first MOS-FET,
wherein,
each bit of digital data for controlling the capacitance is supplied to a gate of said first MOS-FET and said inverter in each of said series circuits, and
the capacitance which varies in response to a value of the digital data is obtained between said first terminal and said second terminal.

2. The variable capacitance circuit according to claim 1, wherein said pull-up resistor is connected between a drain of a second MOS-FET and a source of a third MOS-FET.

3. The variable capacitance circuit according to claim 1 or 2, wherein the gate width of said first MOS-FET is proportional to the value of said capacitor connected to said first MOS-FET, and a Q value of variable capacitance obtained between said first terminal and said second terminal is fixed.

4. A variable capacitance circuit, comprising:
- a plurality of series circuits of a first capacitor, a path of the drain-source of a MOS-FET and a second capacitor connected in parallel between a first terminal and a second terminal;
- in each of said series circuits, a first pull-up resistor connected between an output terminal of an inverter and the drain of said MOS-FET;
- a second pull-up resistor connected between the output terminal of said inverter and the source of said MOS-FET wherein,
- each bit of digital data for controlling the capacitance is supplied to a gate of said MOS-FET and said inverter in each of said series circuits, and
- the capacitance which varies in response to a value of the digital data is obtained between said first terminal and said second terminal.

5. The variable capacitance circuit according to claim 1, 2 or 4, wherein a pull-up voltage obtained by said pull-up resistor is set so as to have a positive temperature coefficient.

* * * * *